(12) United States Patent
Sanasi

(10) Patent No.: US 9,697,906 B2
(45) Date of Patent: Jul. 4, 2017

(54) CONTROLLER FOR BIASING SWITCHING ELEMENT OF A PAGE BUFFER OF A NON VOLATILE MEMORY

(71) Applicant: SK hynix Inc., Gyeonggi-do (KR)

(72) Inventor: Alessandro Sanasi, Agrate Brianza (IT)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/214,161

(22) Filed: Jul. 19, 2016

(65) Prior Publication Data

US 2017/0025180 A1   Jan. 26, 2017

(30) Foreign Application Priority Data

Jul. 20, 2015 (IT) .............................. UB2015A2310

(51) Int. Cl.
*G11C 16/26* (2006.01)
*G11C 16/10* (2006.01)
(Continued)

(52) U.S. Cl.
CPC ................ *G11C 16/26* (2013.01); *G11C 7/04* (2013.01); *G11C 16/0483* (2013.01); *G11C 16/06* (2013.01); *G11C 16/08* (2013.01); *G11C 16/10* (2013.01); *G11C 16/24* (2013.01); *G11C 16/3418* (2013.01); *G11C 29/028* (2013.01); (Continued)

(58) Field of Classification Search
CPC . H01L 29/792; H01L 45/145; H01L 27/2463; H01L 45/1253; H01L 27/2436; H01L 45/04; H01L 45/16; H01L 45/1233; G11C 13/0069; G11C 13/0097; G11C 8/14; G11C 16/26; G11C 7/04; G11C 29/028; G11C 16/3418; G11C 16/24; G11C 16/06; G11C 29/42; G11C 16/08; G11C 16/0483; G11C 16/10; G11C 11/5642;
(Continued)

(56) References Cited

U.S. PATENT DOCUMENTS 7,009,882 B2 * 3/2006 Chen ...................... G11O 5/143
365/185.18
8,908,445 B2 * 12/2014 He .......................... G11C 16/08
365/185.11
(Continued)

FOREIGN PATENT DOCUMENTS

KR   1020090049373   5/2009

OTHER PUBLICATIONS

Extended Search Report Issued by Italian Patent office on Mar. 18, 2016.

*Primary Examiner* — Harry W Byrne
*Assistant Examiner* — Ajay Ojha
(74) *Attorney, Agent, or Firm* — IP & T Group LLP

(57) ABSTRACT

A controlling block for a non-volatile memory device including a switching element coupling a bit-line with the corresponding page buffer, includes: a look-up table configured to store a plurality of address zones; and a matching logic configured to match one address zone among the plurality of address zones based on an inputted row address and generate a bias voltage, based on the address zone, to the switching element for reading operation of the non-volatile memory, wherein the plurality of address zones are defined by grouping word-lines having a I-V characteristic which differs for a current value different from a prefixed value.

19 Claims, 15 Drawing Sheets

(51) Int. Cl.
*G11C 29/42* (2006.01)
*G11C 16/08* (2006.01)
*G11C 16/04* (2006.01)
*G11C 7/04* (2006.01)
*G11C 16/06* (2006.01)
*G11C 16/24* (2006.01)
*G11C 16/34* (2006.01)
*G11C 29/02* (2006.01)
*G11C 7/10* (2006.01)
*G11C 7/12* (2006.01)
*G11C 8/06* (2006.01)
*G11C 11/56* (2006.01)
*G11C 29/04* (2006.01)

(52) U.S. Cl.
CPC ............ *G11C 29/42* (2013.01); *G11C 7/1078* (2013.01); *G11C 7/12* (2013.01); *G11C 8/06* (2013.01); *G11C 11/5642* (2013.01); *G11C 2029/0403* (2013.01); *G11C 2029/0411* (2013.01)

(58) Field of Classification Search
CPC . G11C 2029/0411; G11C 7/1078; G11C 7/12; G11C 2029/0403; G11C 8/06
See application file for complete search history.

(56) References Cited

U.S. PATENT DOCUMENTS

| | | |
|---|---|---|
| 2006/0050593 A1 | 3/2006 | Toyama et al. |
| 2010/0290276 A1 | 11/2010 | Choi |
| 2010/0329008 A1 | 12/2010 | Cho |
| 2011/0038215 A1 | 2/2011 | Huh et al. |
| 2012/0099387 A1 | 4/2012 | Shim et al. |
| 2014/0133229 A1 | 5/2014 | Kamei et al. |
| 2014/0160846 A1 | 6/2014 | Lee et al. |
| 2015/0016189 A1 | 1/2015 | Son |
| 2015/0193299 A1 | 7/2015 | Hyun et al. |

\* cited by examiner

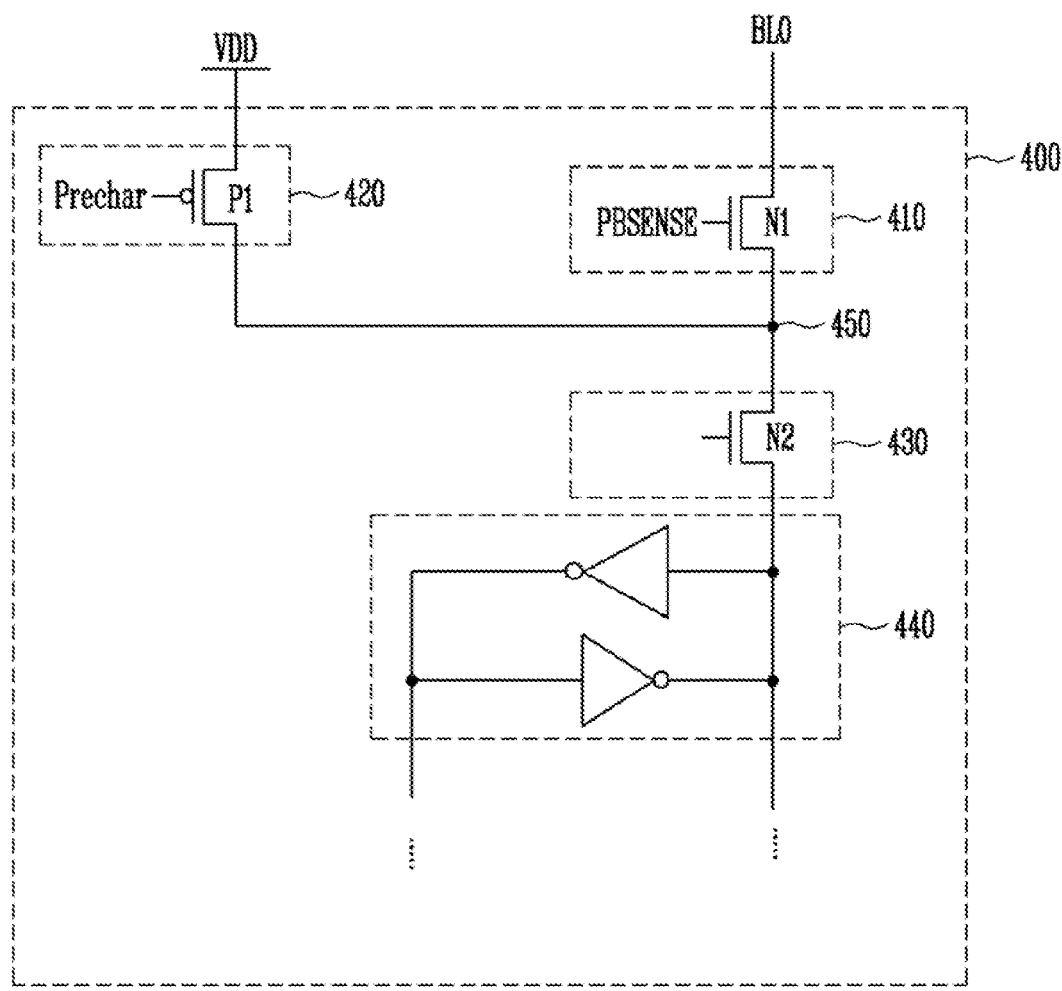

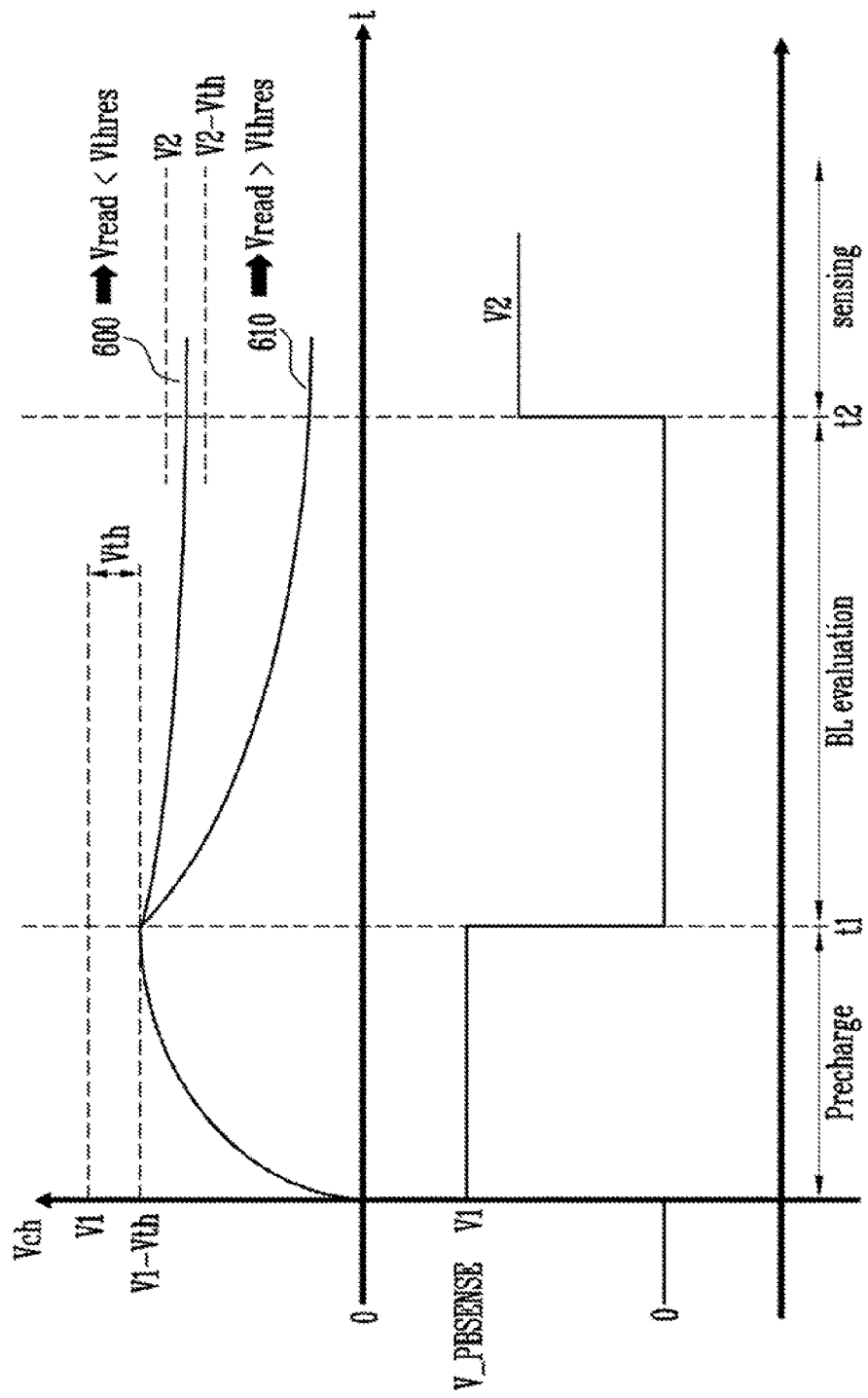

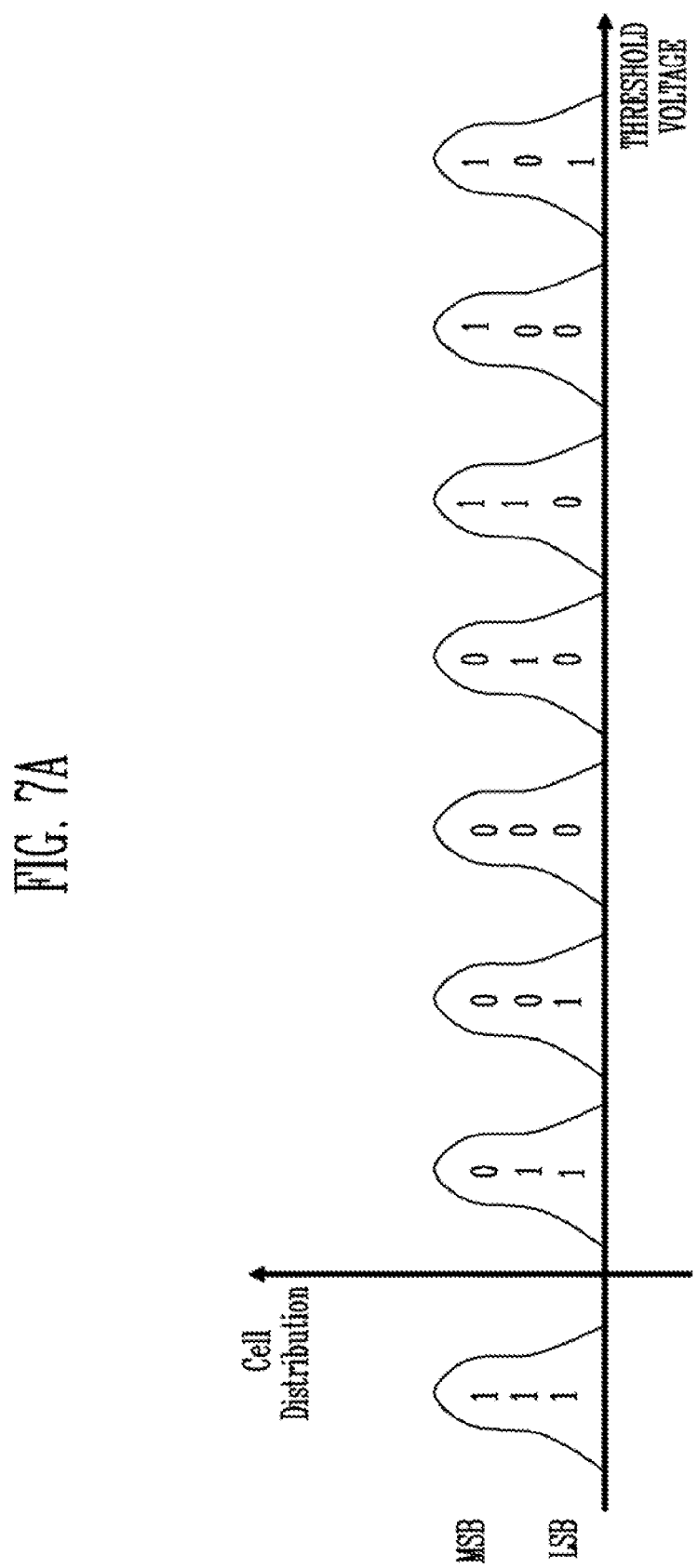

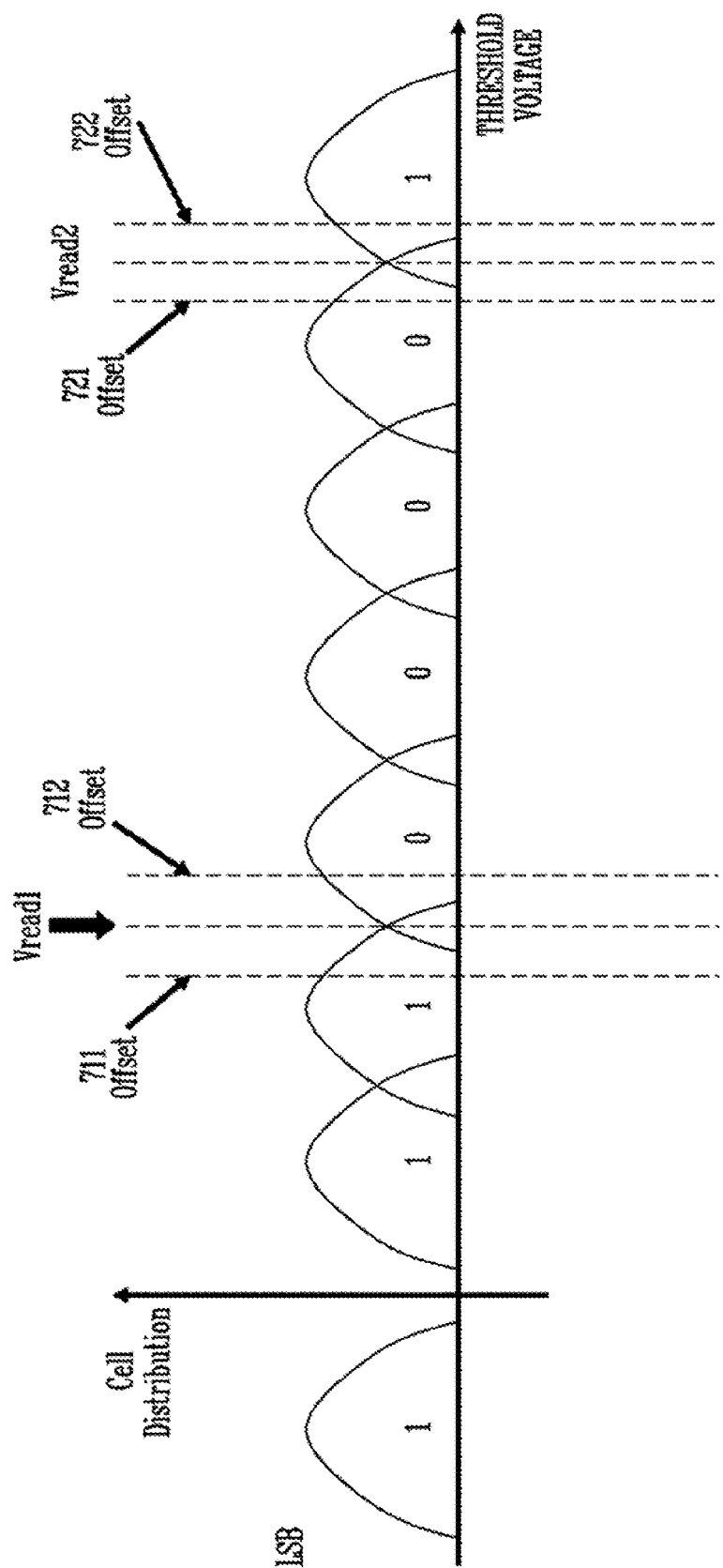

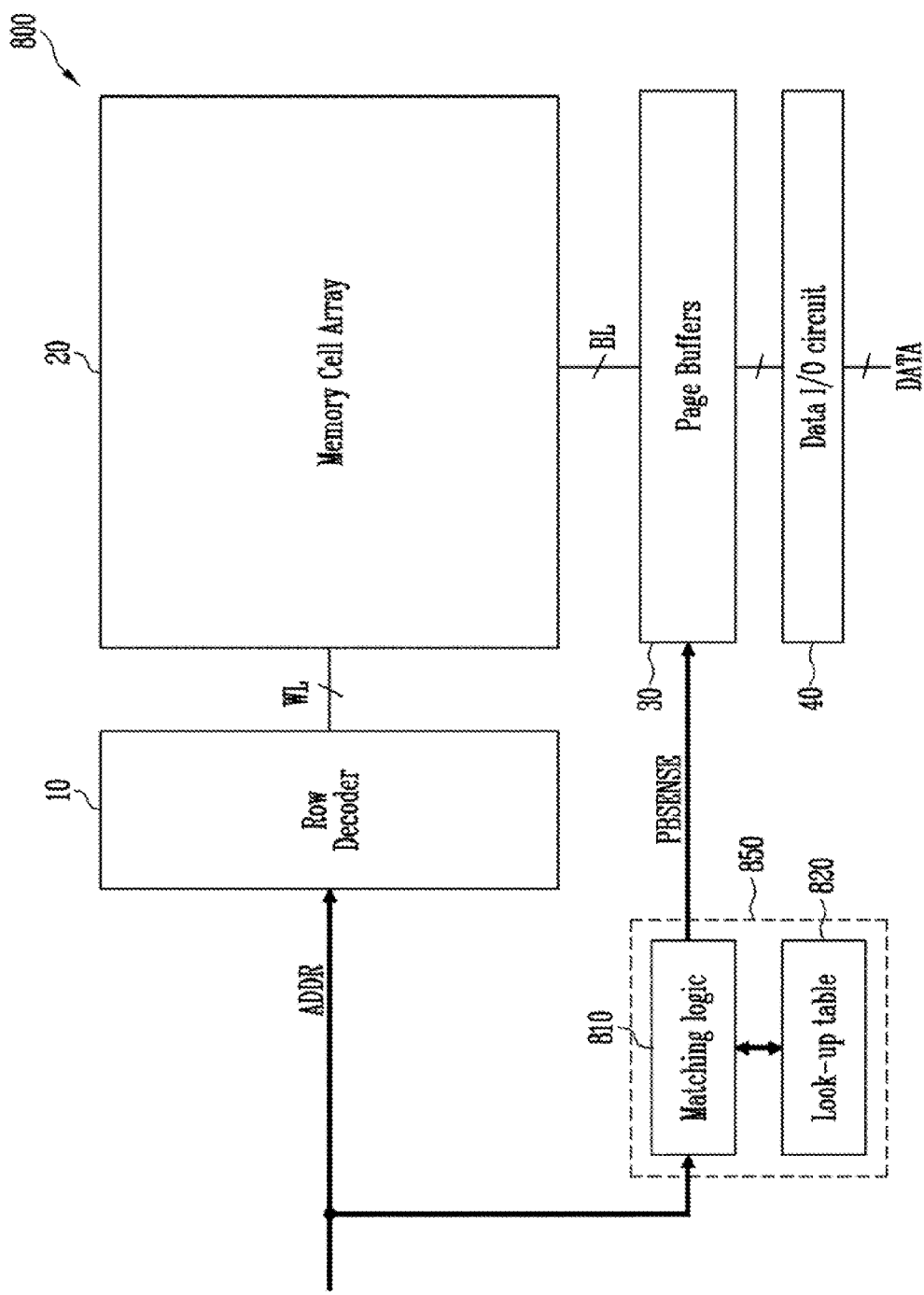

FIG. 9A

| Zone | Address range | PBSense voltage |
|---|---|---|
| 1 | 0 ... Address_1 | $V_{PB\_1}$ |
| 2 | Address_1 + 1 ... Address_2 | $V_{PB\_2}$ |
| 3 | Address_2 + 1 ... Address_3 | $V_{PB\_3}$ |
| ...... | ...... | ...... |
| N-1 | Address_(N-2) + 1 ... Address_(N-1) | $V_{PB\_(N-1)}$ |
| N | Address_(N-1) + 1 ... Address_(N) | $V_{PB\_(N)}$ |

| Zone | Address range | PBSense offset |
|---|---|---|
| 1 | 0 ... Address_1 | $\Delta V_{PB\_1}$ |
| 2 | Address_1 + 1 ... Address_2 | $\Delta V_{PB\_2}$ |
| 3 | Address_2 + 1 ... Address_3 | $\Delta V_{PB\_3}$ |
| ...... | ...... | ...... |
| N-1 | Address_(N-2) + 1 ... Address_(N-1) | $\Delta V_{PB\_(N-1)}$ |
| N | Address_(N-1) + 1 ... Address_(N) | $\Delta V_{PB\_(N)}$ |

820

CONTROLLER FOR BIASING SWITCHING ELEMENT OF A PAGE BUFFER OF A NON VOLATILE MEMORY

CROSS-REFERENCE TO RELATED APPLICATION

The present application claims priority under 35 U.S.C. §119(a) to Italian patent application No. 102015000036057 filed on Jul. 20, 2015, which is incorporated herein by reference in its entirety.

BACKGROUND

Field of the Invention

The present disclosure relates generally to a non-volatile memory, such as a flash memory device.

Description of Related Art

Among various types of a non-volatile memory such as flash memory devices, NAND-type flash memory devices are increasingly used as a high capacity data storage media. Each cell of a flash memory device is programmed to store information by trapping electrons in a floating gate. The programming operation is performed by driving a strong positive voltage on the control gate to force a current to flow from the channel through the floating gate to the control gate, a phenomenon known as the "Fowler Nordheim Tunneling" effect. A control gate terminal is connected to a word-line of the flash memory, and a voltage is provided to the control gate terminal through the word-line. Each memory cell can store a single bit which is called as single level memory cell (SLC), or alternatively, each cell can store multiple bits which is called as multiple level memory cell (MLC). In both SLC and MLC, information stored in each cell is defined by a corresponding threshold voltage of the memory cell.

FIG. 1 is a block diagram of an example of a flash memory device 100. According to the example of FIG. 1, the flash memory device 100 comprises a row decoder 10, a memory cell array 20, a page buffer block 30, and a data input/output (I/O) circuit 40. The memory cell array 20 is connected to the page buffet block. 30 through bit-lines BL and is connected to the row decoder 10 through word-lines WL and an additional conductive line. The additional conductive line may be, for example, a drain selection line or a source selection line for addressing a specific string. The memory cell array 20 includes a plurality of strings, each including a plurality of memory cells. Each memory cell, namely the floating gate of each memory transistor, stores data transferred from the page buffer block 30 under control of the row decoder 10, and transfers the stored data to the page buffer block 30 under control of the row decoder 10. Memory cells are arranged at the intersections of the plurality of bit-lines BL and the plurality of word-lines WL, respectively.

The page buffer block 30 is connected to the memory cell array 20 through the bit-lines BL. The page buffer block 30 is also connected to the data input/output circuit 40. The page buffer block 30 sets the bit-lines BL during program, read, and erase operations. The page buffer block 30 senses data stored in a memory cell of the memory cell array 20 during a read operation. The data input/output circuit 40 is connected to the page buffer block 30. The data input/output circuit 40 exchanges data DATA with an external device. The data input/output circuit 40 transfers write date to the page buffer block 30 for a writing operation. The data input/output circuit 40 may include components, such as a data buffer and a column pass gate (not shown), which are well known in the art.

The row decoder 10 is connected to the memory cell array 20. The row decoder 10 receives an external address ADDR for selecting a word line among the plurality of word lines WL1-WLm. The row decoder 10 is capable of driving the source selection line and the drain selection line of the string to which the addressed cells belong to. The row decoder 10 may apply various voltages, such as a program voltage, a pass voltage, a read voltage, and a ground voltage, to the word-lines WL according to the operation mode of the memory cell array 20.

FIG. 2 is a block diagram of the memory cell array 20 of the flash memory device 100 in FIG. 1.

The memory cell array 20 includes a plurality of blocks 50. Each block 50 includes a plurality of strings 60. Each string includes a plurality of memory cells in which data are stored. Memory cells are arranged at the intersections of the plurality of bit-lines BL0~BLm and the plurality of word-lines WL0~WLr+k−1, respectively. Strings can be selected or deselected by a drain selection line (e.g., DSL0, DSLj, DSLn), and by a source selection line (e.g., SSL0, SSLj, SSLn). Bit-lines BL0~BLm of the memory cell array 20 are connected to the page buffer block 30 of FIG. 1. Word-lines WL, drain selection lines DSL and source selection lines SSL are connected to the row decoder 10 of FIG. 1.

FIG. 3 shows a detailed structure of respective strings and memory cells in the memory cell array 20 of FIG. 7.

FIG. 3 shows four strings 60 in the memory cell array 20. Each string 60 includes a plurality of memory cells 70 in which data is stored. In the example of FIG. 3, one string includes four memory cells, but the number of the memory cells included in one string may vary depending on design. The memory cells 70 are arranged at the intersections of the plurality of bit-lines BL0, BL1 and the plurality of word-lines WL0~WL7, respectively. Strings can be selected or deselected by the drain selection line (e.g., DSL0, DSL1), and by the source selection line (e.g., SSL0, SSL1). Bit-lines BL0, BL1 of the memory cell array 20 are connected to the page buffer block 30 of FIG. 1. The word-lines WL0~WL7, the drain selection lines DSL0, DSL1 and the source selection lines SSL0, SSL1 are connected to the row decoder 10 of FIG. 2.

The drain selection line DSL0 or DSL1 is connected to the gate of the drain select transistor DST of each string. The source selection line SSL0 or SSL1 is connected to the gate of the source select transistor SST of each string. To make a specific string be driven by the bit-line, a high voltage can be applied to the gate of the SST and the DST to switch them on. Thanks to the drain select transistor DST, the source select transistor SST, the source selection line SSL, and the drain selection line DSL, specific strings belonging to the same row can be specifically chosen to carry out one of operations such as program, erase, and read operations. The other strings, which are not selected for the operation, are decoupled from the bit-lines by applying a low voltage to the gates of the respective DST and SST of those strings.

FIG. 4A schematically is a block diagram of a page buffer block 30 and a data input/output (I/O) circuit 40 in FIG. 1. FIG. 4B is a detailed circuit diagram of a page buffer 400 of FIG. 4A.

The page buffer block 30 includes a plurality of page buffers PB0 to PBr including page buffers 400, 401 and 402. Each of the page buffers 400, 401, 402 is connected to the corresponding bit-lines penetrating though the memory cell array 20. Each of the page buffers 400, 401, 402 sets the corresponding bit-line BL during program, read, and erase operations, and senses the data stored in each memory cell of the memory cell array 20 during the read operation. The data input/output (I/O) circuit 40 is connected to the page buffer block 30.

The page buffer 400 of FIG. 4B comprises a first NMOS transistor N1 410, a PMOS transistor P1 420, a second NMOS transistor N2 430, and a latch 440 including a first inverter I1 and a second inverter I2. Any circuit elements unnecessary to explain the operation are omitted from the drawing.

The PBSENSE voltage is applied to the gate of the first NMOS transistor N1 410. The PMOS transistor P1 420 acts as a charge pump to provide a high voltage to the drain of the first NMOS transistor N1 410 when charging of the bit-line BL0 is required. The second NMOS transistor N2 430 is used for switching on and off the latch 440 between the pre-charging stage and the bit-tines sensing stage.

One page buffer may be connected to a plurality of bit-lines, for example, two bit lines including an even bit-line and an odd bit-line (not shown). In this case, two switching transistors may be arranged between the first NMOS transistor N1 and the two bit-lines. In other words, an odd bit-line switching transistor may be arranged between the first NMOS transistor N1 and the odd bit-line, and an even bit-line switching transistor may be arranged between the first NMOS transistor N1 and the even bit-line. Such configuration is known, and for simplicity of explanation, the odd bit-line switching transistor and the even bit-line switching transistor are not shown in the figures.

As the density of memory cells constantly increases in order to store more data in a given area, the distance or pitch between the bit lines BLs is drastically reduced, and the width of the bit lines BLs becomes smaller and smaller, therefore causing higher resistances of the bit-lines BLs. These high resistance values are not negligible for the read operation of a flash memory, because they introduce different biasing conditions for the operation of the memory device. Particularly, when a multiple level memory cell (MLC) scheme is used, requiring more sophisticated control, an incorrect bias can result in increased reading errors. Moreover, as the flash memory becomes older, the threshold voltage of each cell can deviate slightly from the desired value, which may also causes reading errors.

Therefore, a novel method for a more precise control of a read operation of a flash memory is needed.

SUMMARY

Embodiments of the invention are directed to a scheme for adjusting the bias voltage of the switching element of a page buffer of a non-volatile memory based on inputted address information. The method is capable of reflecting different resistive values of the bit-lines depending on an address zone which the inputted address belongs to.

In an embodiment of the invention, a controlling block for a non-volatile memory device including a switching element coupling a bit-line with the corresponding page buffer, comprising: a look-up table configured to store a plurality of address zones; and a matching logic configured to match one address zone among the plurality of address zones based on an inputted row address and generate a bias voltage, based on the address zone, to the switching element for reading operation of the non-volatile memory, wherein the plurality of address zones are defined by grouping word-lines having a I-V characteristic which differs for a current value different from a prefixed value.

BRIEF DESCRIPTION OF THE DRAWINGS

The characteristics and advantages of the disclosure will be apparent from the following description of embodiments thereof given by way of indicative and non-limiting example with reference to the annexed drawings, in which:

FIG. 4B is a detailed circuit diagram of the page buffer of FIG. 4A.

FIG. 6B is a timing diagram of a read operation of a flash memory device.

FIG. 7A shows a threshold voltage distribution of 3 bit levels in a flash memory device.

FIG. 7B shows a threshold voltage distribution according to least significant bit (LSB) bits of FIG. 7A.

FIG. 8 is a block diagram of a flash memory device, according to an embodiment of the present invention.

FIGS. 9A and 9B show look-up tables, according to embodiments of the present invention.

DETAILED DESCRIPTION OF THE EMBODIMENTS

Figure 1:
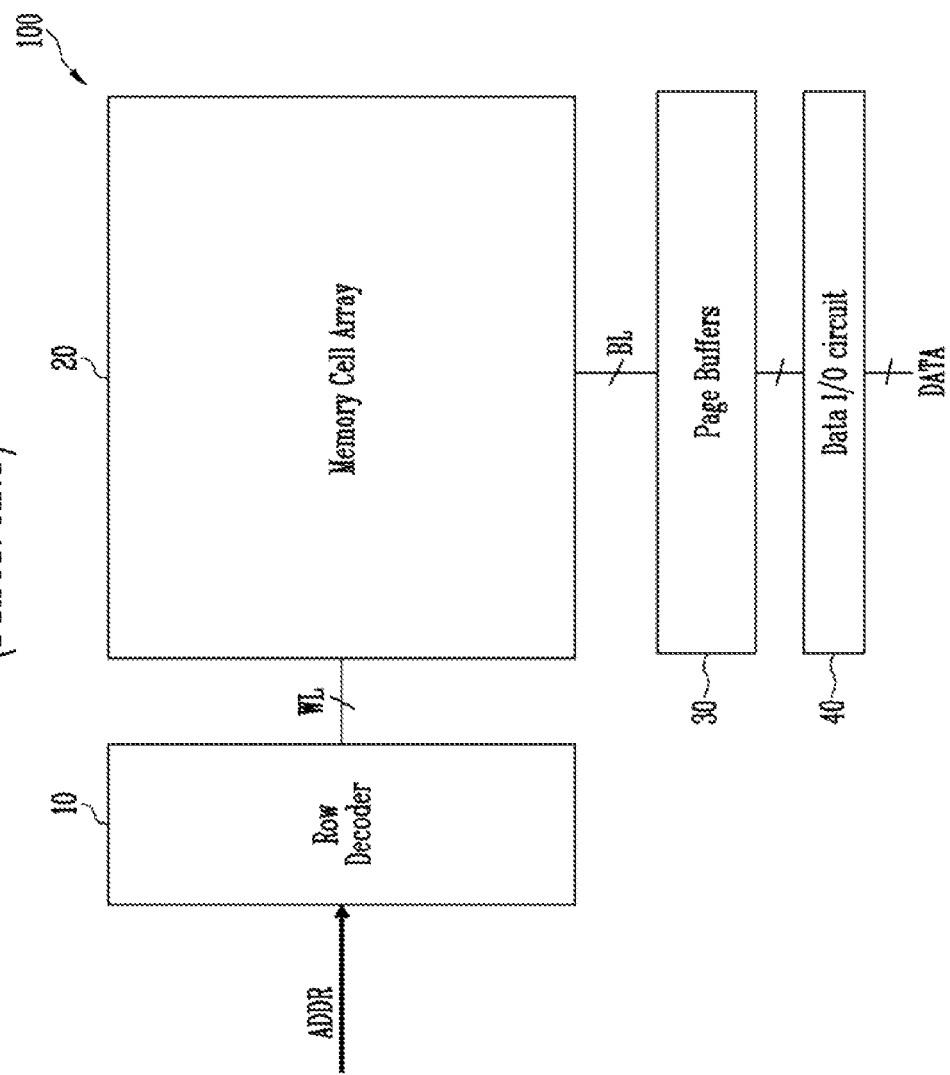
FIG. 1 is a block diagram of an example of a flash memory device.
Figure 2:
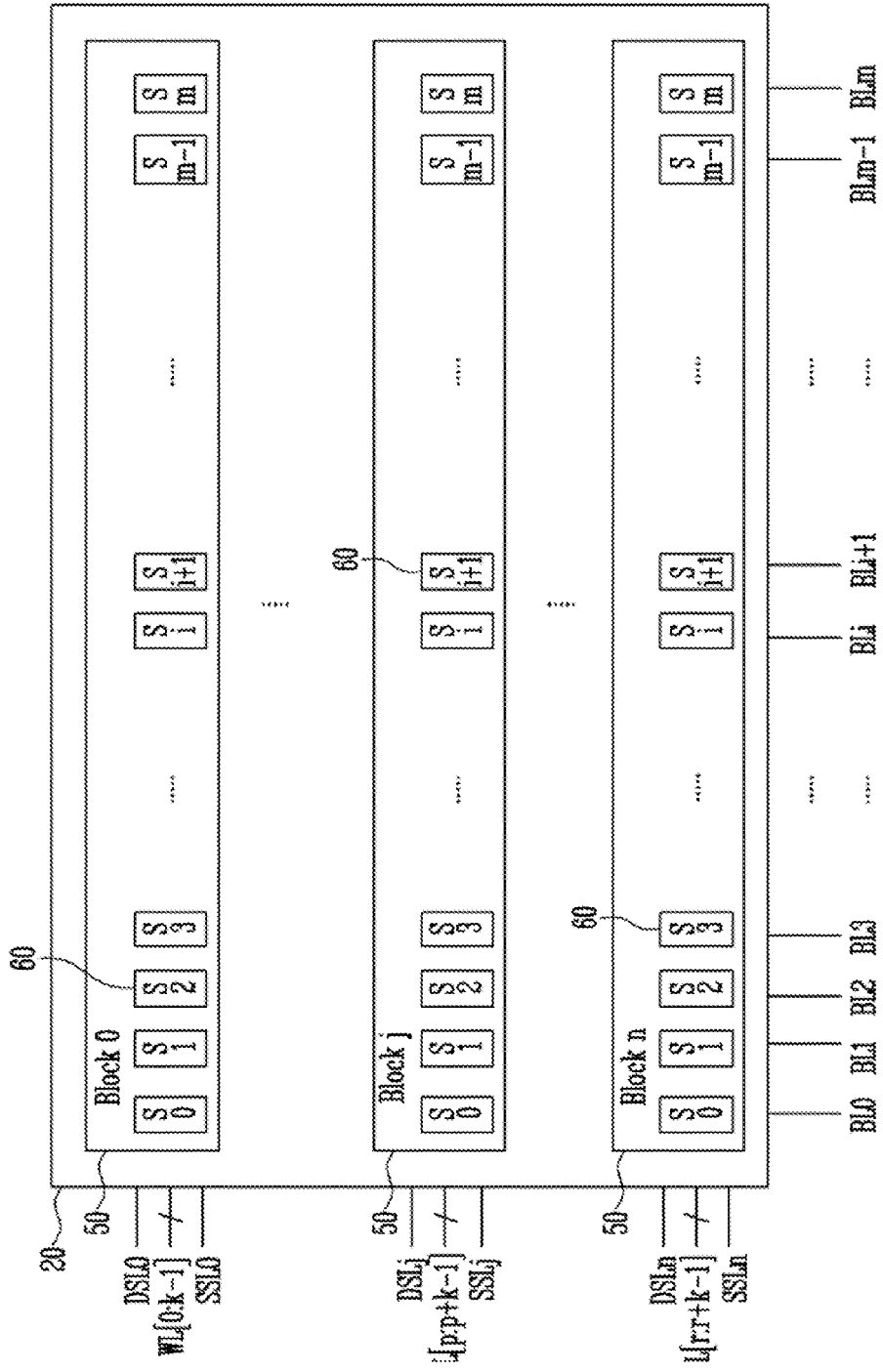
FIG. 2 is a block diagram of a memory cell array of the flash memory device of FIG. 1.
Figure 3:
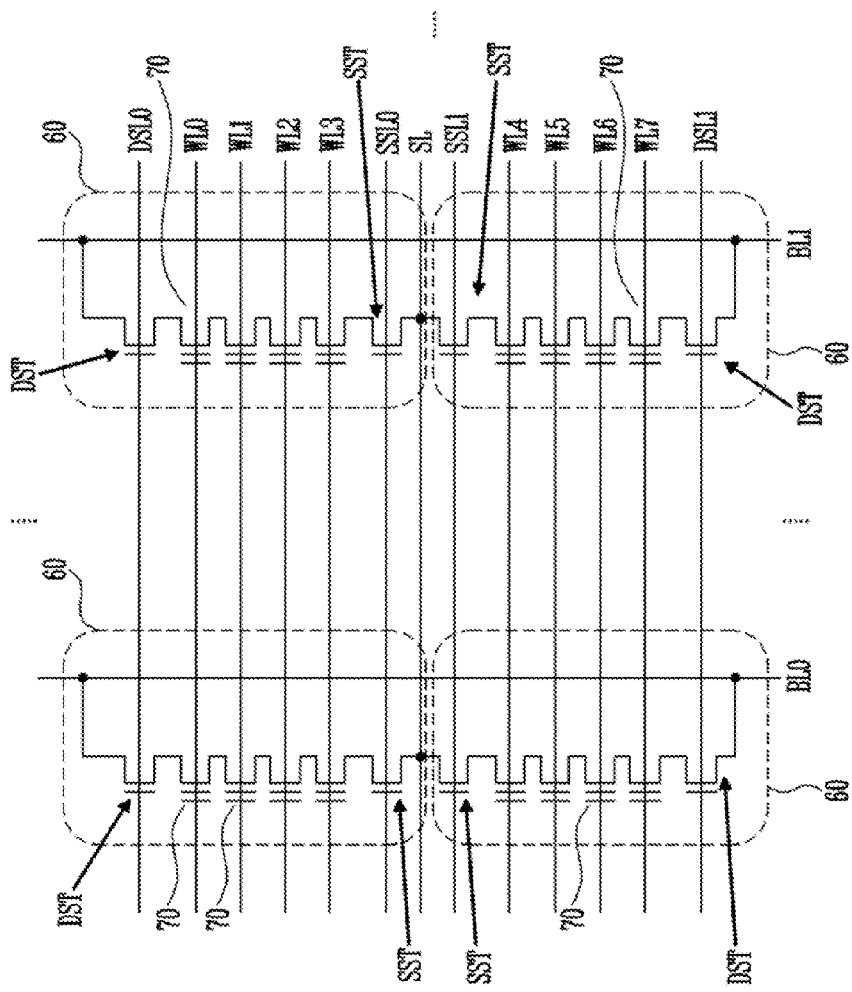
FIG. 3 shows a detailed structure of strings and memory cells in the memory cell array of FIG. 2.

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention. The terms and words used in the specification and claims should not be construed as their ordinary or dictionary sense. On the basis of the principle that the inventor can define the appropriate concept of a term in order to describe his/her own invention in the best way, they should be construed as a meaning and concepts for complying with the technical idea of the present invention. In addition, detailed descriptions of constructions well known in the art may be omitted to avoid unnecessarily obscuring the gist of the present invention.

In the drawings, corresponding features are identified by the same reference numerals.

Figure 4A:
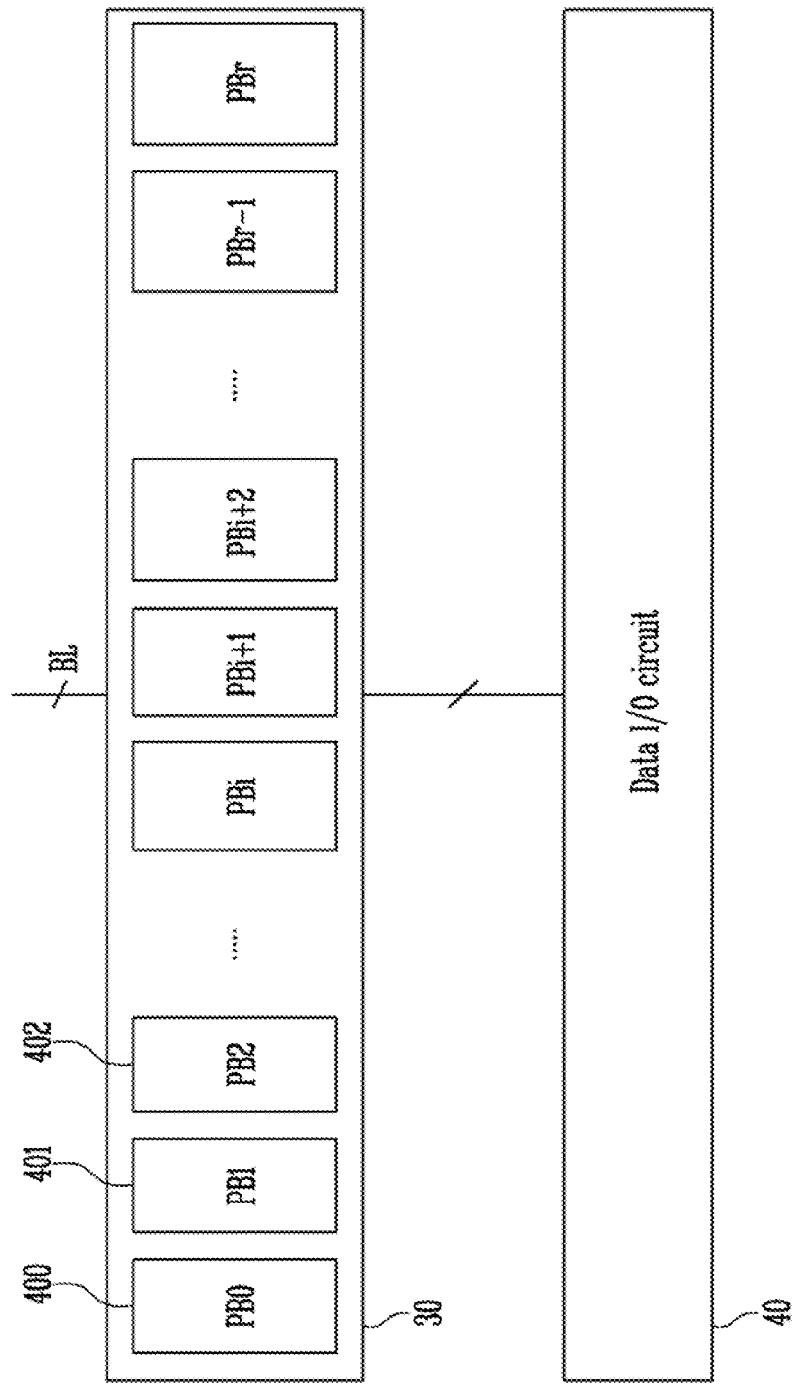
FIG. 4A is a block diagram of a page buffer block and a data I/O circuit of FIG. 1.
Figure 5A:
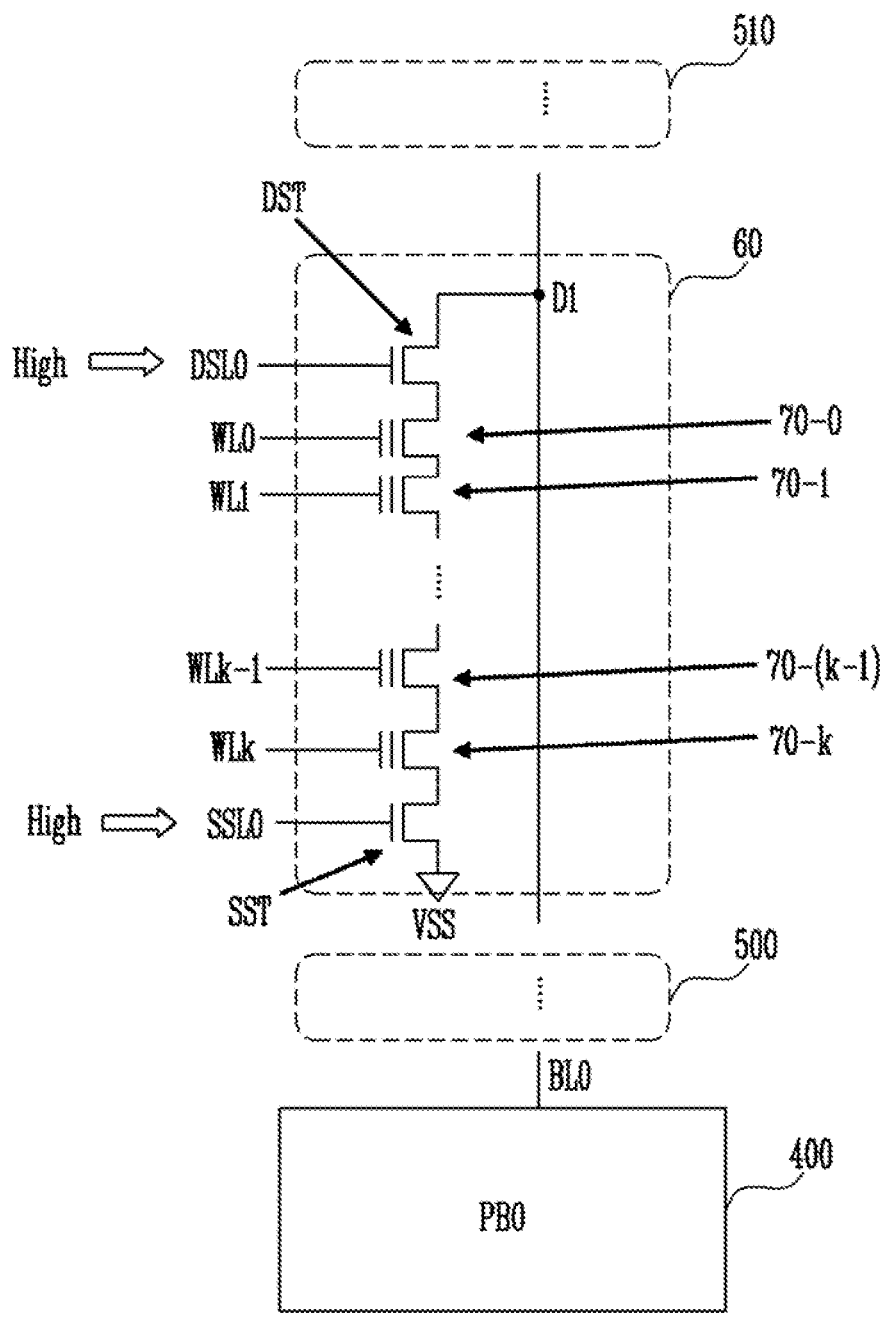
FIG. 5A shows a selected string in a memory cell array and a page buffer connected to the selected string.

FIG. 5A shows a selected string 60 in the memory cell array 20 of FIG. 1 and a page buffer 400 of FIGS. 4A and 4B connected to the selected string 60.

The selected string 60 includes a drain select transistor DST whose gate is connected to a drain selection line DSL0, a source select transistor SST whose gate is connected to a source selection line SSL0. High voltage is provided to the drain selection line DSL0 and the source selection line SSL0 respectively, to connect the selected string to the corresponding bit-line BL0. The selected string is a string being selected by the row decoder 10 of FIG. 1 for the program or read operation.

The cell transistors 70-0~70-k are connected with each other in series. The gates of the cell transistors 70-0~70-k are connected with corresponding word-lines WL0~WLk. The drain of the first cell transistor 70-0 is connected to the source of the drain select transistor DSL0. The source of the last cell transistor 70-k is connected to the drain of the source select transistor SST.

When a specific string 60 among a plurality of strings coupled to the same bit-line is selected, the other strings are deselected, i.e. decoupled, from the bit-line by applying a low voltage to their drain select transistors and source select transistors. Therefore, all other strings in the blocks indicated as 500 and 510 in FIG. 5A are electrically decoupled from the bit-lines.

Figure 5B:
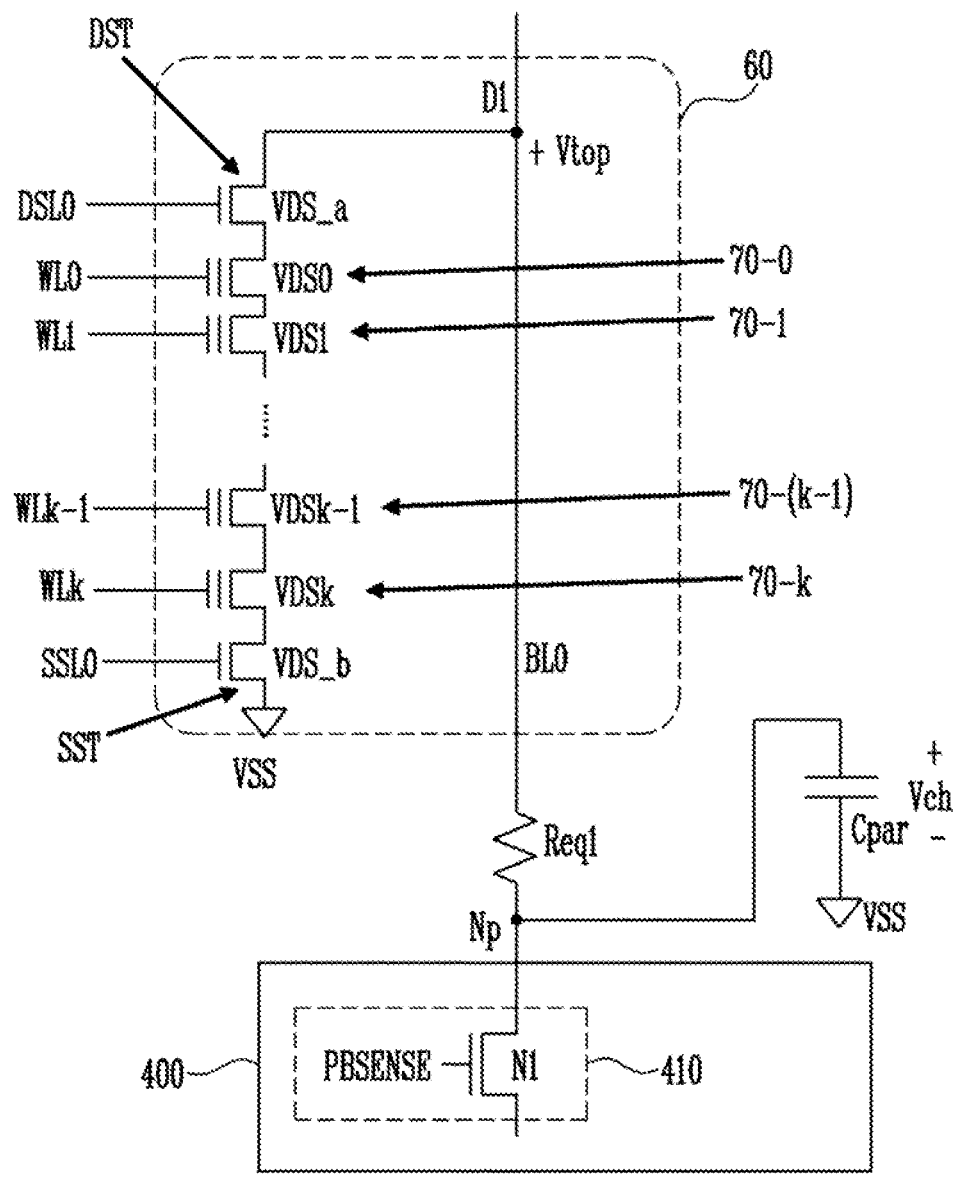
FIG. 5B is an equivalent circuit diagram of FIG. 5A, reflecting the resistance of bit-lines.

Due-to a non-negligible resistance of the bit-line, the circuit can be modeled as FIG. 5B.

FIG. 5B is an equivalent circuit diagram of FIG. 5A, reflecting the resistance of the bit-fines.

A first equivalent resistance Req1 can be modeled as interposed between the selected string 60 and the page buffer 400. The first equivalent resistance Req1 can be varied according to the distance of the selected string 60 from the page buffer 400. That is, the longer the distance between the selected string 60 and the page buffer 400 becomes, the greater the first equivalent resistance Req1 becomes. The shorter the distance between the selected string 60 and the page buffer 400 becomes, the lesser the first equivalent resistance Req1 becomes. Therefore, the first equivalent resistance Req1 varies according to the location of the inputted address for access in the memory cell array. Specifically, the first equivalent resistance Req1 varies according to its vertical direction location, i.e. the column or Y direction in the memory cell array 20.

According to the modeling, a parasitic capacitance Cpar may be considered as inserted at the node Np between the first resistance Req1 and the page buffer 400.

FIG. 6B is a timing diagram of a read operation of a flash memory device. Read operation of memory cells will be explained with reference to FIGS. 4B, 5B, 5C, 6B together.

In a read operation of the memory cells, at first the bit-line which the string is connected to is pre-charged, during a so called pre-charging stage. To pre-charge, the first PMOS transistor P1 420 of the page buffer 400 in FIG. 4B is switched on by applying a tow voltage Prechar to the gate of the first PMOS transistor P1. A first voltage V1 is applied to the gate of the first NMOS transistor N1, also indicated as PBSENSE, as shown in FIG. 6B. Then, the voltage Vch across the parasitic capacitance Cpar connected to the source of the first NMOS transistor N1 410 of FIG. 5B, is rising up to V1-Vth, where Vth is a threshold voltage of the first NMOS transistor N1, as shown in FIG. 6B. Vch does not exceed V1-Vth, because at the point Vch exceeds V1-Vth the first NMOS transistor N1 410 would be switched off dropping Vch below to V1-Vth. During the pre-charging stage, the second NMOS transistor N2 430 of FIG. 4B is turned off, because the latch 440 is used for sensing the voltage of the bit-line after evaluation.

After the pre-charging stage, at t1 of FIG. 6B, a bit-line (BL) evaluation stage starts. The voltage PBSENSE becomes 0 to decouple the page buffer 400 from the bit-line BL0 of FIG. 5B. The voltage Vch across the parasitic capacitance Cpar starts to discharge. The operation will be explained in detail in reference to FIG. 5C.

Figure 5C:
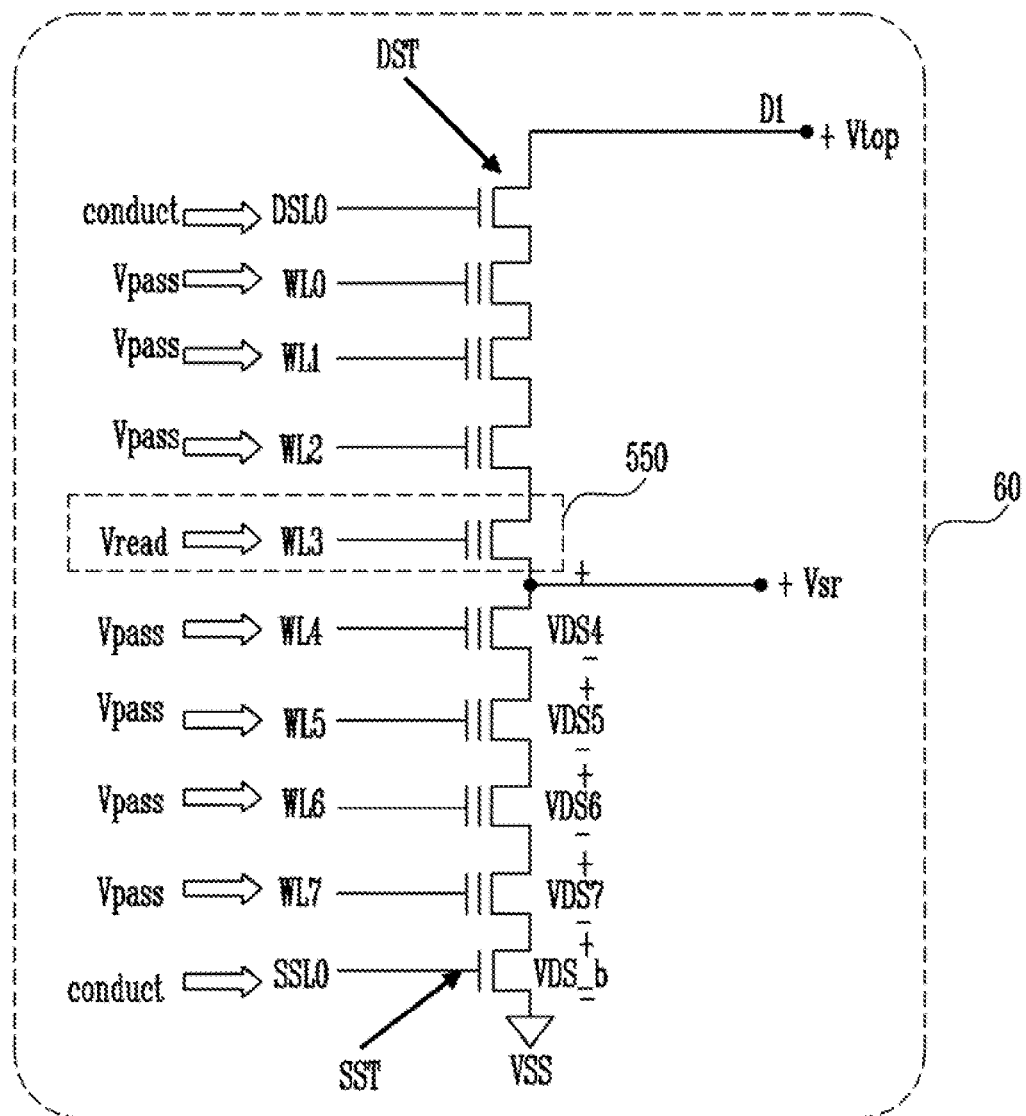
FIG. 5C shows voltages provided to each word-line of a string during the evaluation stage of a read operation.

FIG. 5C shows voltages provided to each word-line of a string during the evaluation stage of the read operation. In FIG. 5C, it is assumed that there are eight cell transistors, i.e. k=7, in each string, but the embodiment is not limited thereto.

As shown in FIG. 5C, HIGH voltage is provided to the gate of the drain select transistor DSL0 and the source select transistor SSL0 to make them conduct. A pass voltage Vpass is applied to the gate of the cell transistors which are not read. The value of the pass voltage Vpass is determined so as to be high enough to make the corresponding cell transistor to conduct, regardless of the electrons trapped in its floating gate. But, the value of the pass voltage Vpass cannot be too high to affect the trapped electrons in the floating gate of each cell transistor. A read voltage Vread is provided to the cell transistor 550 which is to be read.

If the gate-source voltage of the cell transistor 550 being read and thus determined by the read voltage Vread is greater than the threshold voltage of the cell transistor 550, the selected string 60 is made conductive and discharges the bit-line BL0, as the graph 610 of FIG. 6B. If the gate-source voltage of the cell transistor 550 being read and thus determined by the read voltage Vread is less than the threshold voltage of the cell transistor 550, the selected string 60 is not conductive due to low gate voltage provided to the cell transistor 550, as the graph 600 of FIG. 6B. In this case, the bit-line BL0 is not supposed to be discharged, but in practical situation, it slightly discharges due to a leakage current.

After the evaluation stage finishes at t2 in FIG. 6B, the voltage of the bit-line BL0 can be sensed, for example, by providing a second voltage V2 as PBSENSE to the gate of the first NMOS transistor N1 410 of FIG. 4B and by switching on the second NMOS transistor N2 430 to couple the latch 400 to the bit-line.

At the beginning of the evaluation stage, at t1, the voltage Vtop of the top drain node D1 in FIG. 5C is tied to the bit-line voltage, i.e. the voltage Vch across the parasitic capacitance Cpar, the first equivalent resistor Req1, the drain-source voltage VDS_a of the drain select transistor DST, the drain-source voltages VSD0~VDSk in FIG. 5B (e.g., VSD0~VDS7 in FIG. 5C) of the cell transistors, and the drain-source voltage VDS_b of the source selection SST, etc.

Figure 6A:
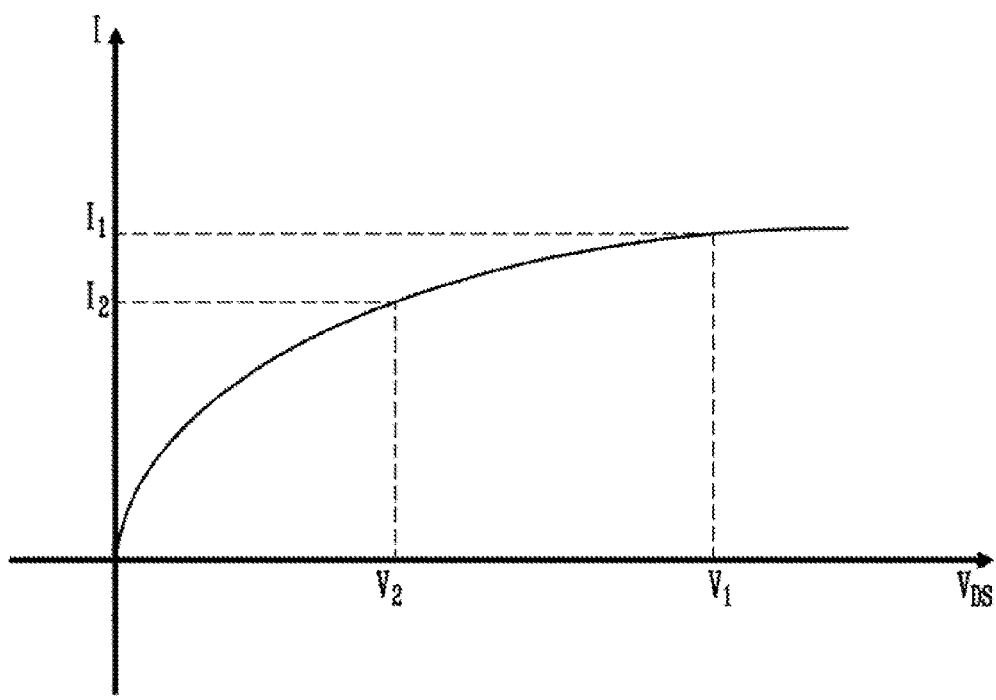
FIG. 6A schematically shows I-V characteristic of a transistor.

Due to the characteristic of a transistor as shown in FIG. 6A, the drain-source voltage of a transistor can undergo a greater change when a small amount of current flowing through it changes. Since the amount of current flowing through the first equivalent resistance Req1 and transistors is the same, the drain-source voltages of the transistors are strongly influenced by the equivalent resistance Req1. In other words, the voltage Vtop of the top drain node D1 in FIGS. 5B to 5C increases when the voltage drop through the equivalent resistance Req1 is lower, while the voltage Vtop of the top drain node D1 decreases when the voltage drop through the equivalent resistance Req1 is higher.

The voltage Vtop of the top drain node D1 also influences the drain-source voltages of the transistors in the selected string 60. For example, the source voltage Vsr of the read cell transistor 550 in FIG. 5C is the sum of drain source voltages VDS_b, VDS7, VDS6, VDS5 and VDS4. The source voltage Vsr of the read cell transistor 550 depends on the voltage Vtop of the top drain node D1. This is because the change of the voltage Vtop affects the source-drain voltage differences of each cell transistor. In other words, the source voltage Vsr becomes higher when the voltage Vtop of the top drain node D1 is higher, while the source voltage Vsr becomes lower when the voltage Vtop of the top drain node D1 is lower.

Normally, the level of the read voltage Vread is fixed. The gate-source voltage of the read cell transistor 550 of FIG. 5C can vary due to the change of the source voltage Vsr of the read cell transistor 550 which is changed according to the first equivalent resistance Req1 of FIG. 5B. Therefore, depending on the location of the selected string in the memory cell array 20, the read voltage Vread can erroneously control the read cell transistor 550. This issue affects the performance of the read operation, more critically in case of (multiple level cells (MLCs).

FIG. 7A shows a threshold voltage distribution of 3 bit levels in a flash memory device. This configuration is also called as Triple Level Cell (TLC).

The threshold voltages of the cell transistors are arranged from left to right, i.e. from the lower value to the high value, while sequentially indicating 111, 011, 001, 000, 010, 110, 100, 101.

FIG. 7B shows a threshold voltage distribution according to least significant bit (LSB) bits of FIG. 7A.

For retrieving an LSB value, the addressed cell transistor can be read, for example, two times, with the gate voltage Vread1 and Vread2. If the addressed string discharges with the gate voltage of Vread1, it means that the threshold voltage of the read cell transistor is below the Vread1 and the LSB is 1.

If the addressed string does not discharge at a gate voltage equal to Vread1, then another read operation with a gate voltage equal to Vread2 may be performed. If the addressed string discharges at the gate voltage Vread2, it means that the threshold voltage of the read cell transistor is below the Vread2 and the LSB is 0. Otherwise, the threshold voltage of the read cell transistor is above Vread2 and LSB is 1.

When the voltage Vsr of the source of the read cell transistor 500 of FIG. 5C varies according to the location of the string in the memory cell array, the actual voltage applied to the read cell transistor 500 in terms of the threshold voltage distribution can vary as shown in FIG. 7B. When the intended voltage is Vread1, the actual voltage applied to the threshold voltage distribution graphs of FIG. 7B can be offset as 711 or 712 due to the change of voltage Vsr. Similarly, when the intended voltage is Vread2, but the actual voltage applied to the threshold voltage distribution graphs of FIG. 7B can be offset as 721 or 722 due to the change of voltage Vsr. These offsets cause an increase of the reading errors detected during error correction of a read operation, till the error level becomes so high that cannot be corrected.

To solve this problem, the voltage PBSENSE can be adjusted depending on the location of the cells to be read, in a vertical direction (column direction, Y direction), i.e., according to the word-lines distribution.

FIG. 8 is a block diagram of a flash memory device 800 according to an embodiment of the present invention.

The flash memory device 800 comprises a row decoder 10, a memory cell array 20, a page buffer block 30, and a data input/output (I/O) circuit 40. The memory cell array 20 is connected to the page buffer block 30 through bit-lines BL and is connected to the row decoder 10 through word-lines WLs and a conductive line (not shown). The conductive line may be, for example, a drain selection line or a source selection line for addressing a specific string. The memory cell array 20 includes a plurality of strings, each including a plurality of memory cells. Each memory cell, namely the floating gate of each cell transistor, stores data transferred from the page buffer block 30 under control of the row decoder 10, and transfers the stored data to the page buffer block 30 under control of the row decoder 10. Memory cells are arranged at the intersections of the plurality of bit-lines BL and the plurality of word-lines WL, respectively.

The page buffer block 30 is connected to the memory cell array 20 through the BL. The page buffer block 30 sets the bit-lines BL during program, read, and erase operations, and senses the data stored in each memory cell of the memory cell array 20 during the read operation. The data I/O circuit 40 is connected to the page buffer block 30. The data I/O circuit 40 exchanges data DATA with an external device. The data I/O circuit 40 transfers to-be-written data to the page buffer block 30 before a writing operation (also referred to as a program operation). The data I/O circuit 40 may include components, such as a data buffer and a column pass gate, which are well known in the art.

The row decoder 10 is connected to the memory cell array 20. The row decoder 10 receives an external address ADDR to select one or more word lines among the plurality of word-lines WL1-WLm. The row decoder 10 is capable of driving the source selection line and the drain selection line of the string which the addressed cells belong to. The row decoder 10 may also apply various voltages, such as a program voltage, a pass voltage, a read voltage, and a ground voltage, to the word-lines WL according to their operation modes.

The flash memory device 800 further comprises a controlling block 850 including a look-up table 820, and a matching logic 810. The look-up table 820 may store a plurality of address zones and corresponding voltage values. The matching logic 810 may match one address zone among the plurality of address zones based on an inputted row address ADDR. The controlling block 850 may provide a bias voltage PBSENSE to the page buffer block 30. In more detail, the controlling block 850 may provide the bias voltage PBSENSE to the switching element 410 coupling the bit-line with the corresponding page buffer 400 in FIG. 4B for the read operation of the flash memory device 800. The bias voltage PBSENSE may be determined based on the voltage value stored in the look-up table 820 corresponding to the matched address zone.

The switching element 410 may be an NMOS transistor N1 410 as shown in FIG. 4B. The bias voltage PBSENSE is provided to the gate of the transistor N1 410 employed as the switching element 410.

In the memory cell array, different address zones are arranged in a vertical direction i.e., column direction). In essence, the different address zones correspond to different word line groups. For example, the distance from the page buffer 400 to an address zone may increase as the address zone includes a higher address number, and the distance from the page buffer 400 to an address zone may decrease as the address zone includes a lower address number. This relationship of distance and number of address may be different depending on the scheme of the row decoder 10. The address zone, which the address to be read belongs to, determines the first equivalent resistance Req1 of FIG. 5B.

More particularly, different addresses would correspond to different behaviors of the memory cells, in particular a different I-V (current-voltage) pattern. This is due to several factors: a cell made on the edge of the wafer comprising the memory cell array would be different from another one made in the inside thereof, the geometry of the cells are always slightly different, as well as the doping levels.

The address zones are thus obtained by an I-V (current-voltage) characteristic of the memory cell array, in particular made during a testing phase, for instance the Wafer Test, and then stored into the look-up table 820.

For example, when cells have a similar I-V characteristic, it may be concluded that they have a comparable resistive path, i.e., a same value for the first equivalent resistance Req1, and that these cells may thus be assigned to a same zone; on the contrary, when the I-V characteristic deviates to a current value higher by a prefixed value ΔI, then the corresponding cell may be assigned to another zone. It is thus obtained a division into address zones or groups of word-lines of the memory cell array according to their I-V characteristics.

Not necessarily homogeneous zones or groups or with the same number of cells are found, since each cell can have different characteristic (e.g., a gradient of doping different), thus changing the I-V pattern; obviously the number of zones or groups should be limited in a reasonable manner for not having an excessive effort for the circuitry; the prefixed value ΔI may be selected at will. For example, the prefixed value ΔI may be selected to equal the sensitivity of the test machine.

FIGS. 9A and 9B show examples of look-up tables according to embodiments of the present invention.

According to the examples of FIGS. 9A and 9B, each of the plurality of address zones are defined by a start address and an end address. For example, as shown in FIG. 9A and FIG. 9B, zone 1 includes addresses in the range of 0 to Address_1. Zone 2 includes addresses in the range of Address_1+1 to Address_2. Zone 3 includes addresses in the range of Address_2+1 to Address_3. Zone N−1 includes addresses in the range of Address_(N−2)+1 to Address_(N−1). Zone N includes addresses in the range of Address_(N−1)+1 to Address_(N).

The address zones can be created during a wafer testing phase, in particular, the I-V characteristic of the memory cell array as obtained during the wafer testing phase may be used to establish the division into address zones or WL groups and store them in the look-up table 810.

In the example of FIG. 9A, the PBSENSE voltages are directly stored in the look-up 820. In the example of FIG. 9B, the PBSENSE offset voltages $\Delta V_{PB}$ are stored in the look-up table 820. The PBSENSE offset voltages $\Delta V_{PB}$ can be added to a reference voltage before being provided as PBSENSE voltage to the page buffer block 30.

The look-up table 820 may also store a plurality of voltage values for each corresponding address zone by taking into account, for example an operating temperature for the device. For example, each different voltage value for the same address zone may be used for a different operating temperature. For example, temperatures of 25° C., −40° C. and 90° for a commercial device may be considered. Other temperatures may be taken into account for a military device.

Alternatively, the controlling block 850 in FIG. 8 may include a plurality of look-up tables for each different operating temperature. In this case, the number of address zone of each look-up table may be different from each other.

In particular, for each temperature of interest, a look-up table may be established by an I-V characteristic of the memory cell array, and thus the corresponding address zones and the obtained look-up tables may be stored therein as configuration tables; then only one look-up table is selected starting from the reading of an on-board temperature sensor. Otherwise, a look-up table may be selected by default, for instance the one corresponding to the environment temperature.

The voltage value stored in the look-up table 820 may be updated based on the result of an error correction operation. The cell degradation to a given biasing condition may be measured by looking at the number of failures with an error correction code (e.g., a low density parity check (LDPC) code).

For example, the voltage value stored in the look-up table 820 can be updated when the number of errors during the read operation exceeds a specific value.

It is possible to extend the embodiment at the system level, where the controlling block 850 in FIG. 8 applies the algorithm with the error correction code (ECC). In particular, when the controlling block 850 finds more errors than could be corrected, it may perform a verification of the correctness of the reading phase. The system may go back to repeat the reading operation, however, applying various PBSENSE voltages that are different, modulated with respect to the one stored into the look-up table 820.

During the life of a flash memory device various cells may become partially degraded. For example, a transistor initially grouped as belonging to a certain address zone, and having a certain corresponding PBSENSE voltage stored into the look-up table 820 may now need a greater PBSENSE voltage, because the memory device as a whole has degraded; in this case, additional voltage value ΔV equal to a minimum value of detectable voltage tied to the internal hardware of the sensing circuit may be stored in the look-up table 820. In particular, a first transfer of data being read at fixed voltage is performed, then the ECC unit may modify the voltage values stored in the look-up table 820 based on the first transfer of data, and then the system may redo the error correction using the modified voltage values.

Figure 10:
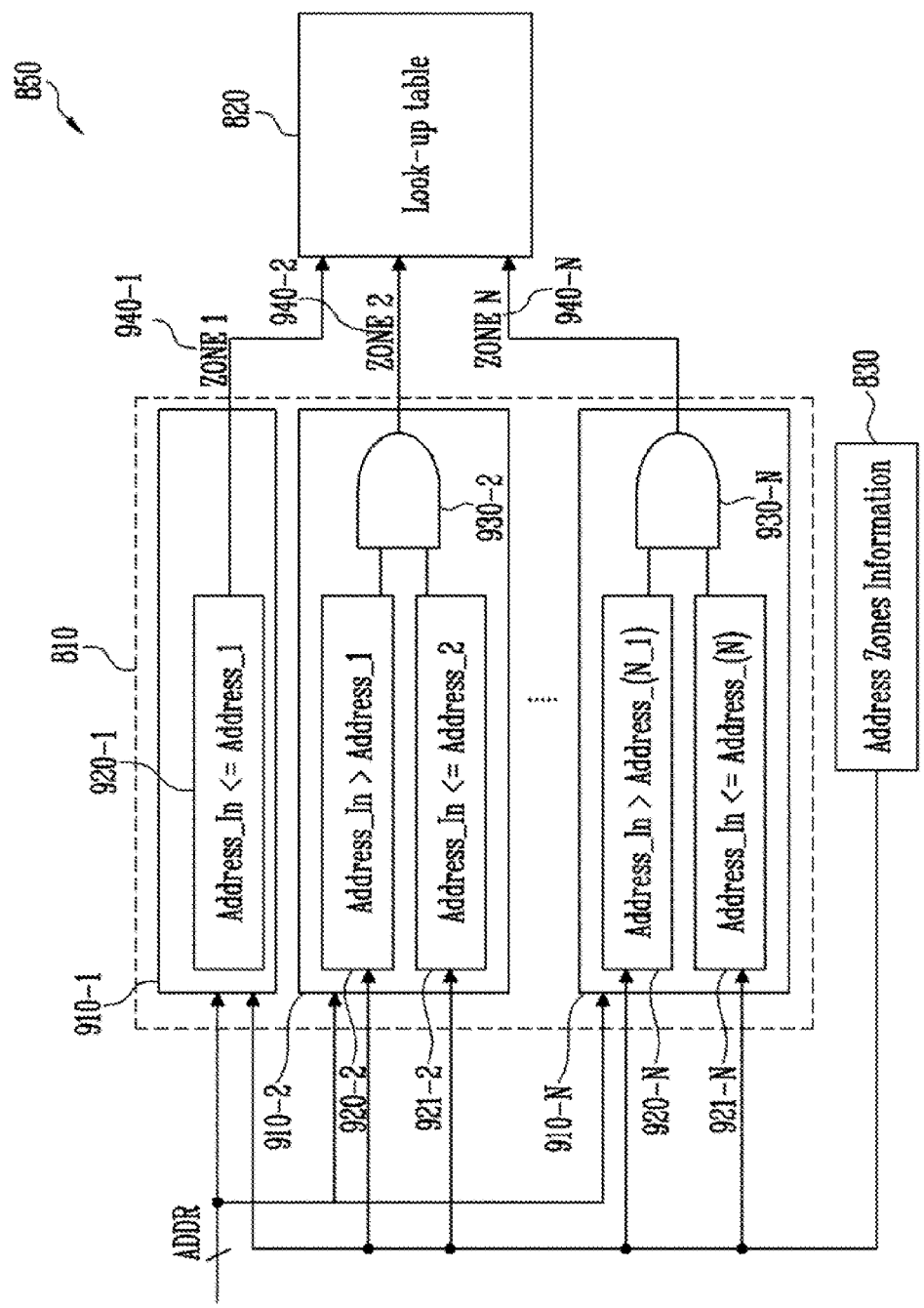
FIG. 10 is a logical level circuit block diagram of a matching block according to an embodiment of the present invention.

FIG. 10 is a logical level circuit block diagram of a matching logic 810 of the controlling block 850 in FIG. 9, according to an embodiment of the invention.

The matching logic 810 may comprise a plurality of comparison blocks 910-1~910-N. Each of the comparison blocks 910-1~910-N corresponds to each of the plurality of address zones, and may receive an inputted row address ADDR and output the corresponding matching signals 940-1~940-N. Each of the matching signals 940-1~940-N indicates whether the inputted row address ADDR belongs to the corresponding address zone or not.

The matching signals 940-1~940-N of the comparison blocks 910-1~910-N are provided to the look-up table 820 to retrieve corresponding voltage value (e.g., PBSENSE voltage or PBSENSE offset voltage), from the look-up table 820.

The comparison blocks 910-1~910-N comprise first logic comparators 920-1~920-N for determining whether the inputted address ADDR is higher than the start address of the corresponding comparison block 910-1~910-N. The comparison blocks 910-1~910-N further comprise a second logic comparators 921-2~921-N for determining whether the inputted address ADDR is lower than the end address of the corresponding comparison block 910-1~910-N. The comparison blocks 910-2~910-N further comprise AND gates 930-2~930-N for receiving the outputs of the first logic comparator 920-2~920-N and the second logic comparator 921-2~921-N and outputting the matching signal 940-1~940-N.

The address matching operation of the controlling block 850 may be simultaneously performed during the rising time of the voltages of the address lines ADDR through which the inputted row address is provided. Therefore, no additional operation time is needed. An additional operation time may degrade the data process rate of the flash memory device.

The controlling block 850 may belong to an external controller of the flash memory device. Alternatively, the controlling block 850 may be embedded in the flash memory device.

A method for adjusting a biasing voltage applied to memory cells of a non-volatile memory device is so obtained. In particular, the method includes the following:

obtaining an I-V characteristic of the memory array and dividing the memory cell array into address zones, each zone comprising a group of word-lines of the memory array cells reflecting different resistive values depending on the memory cell to be read;

providing at least one look-up table for storing the plurality of address zones of the memory cells and corresponding voltage values;

comparing an inputted row address of the memory cell to be read with the plurality of address zones stored in the look-up table through the matching logic;

retrieving a corresponding voltage value from the look-up table; and activating the controlling block including a switching element to provide a bias voltage to the addressed bit-lines, the bias voltage being determined based on the voltage value stored in the look-up table and retrieved in the previous phase.

For example, as already explained, the look-up table 820 may store a plurality of voltage values for each corresponding address zone, each voltage value usable for different operating temperature or a plurality of look-up tables for different operating temperatures may be provided.

Also, the bias voltage stored in the look-up table 820 may be configured to be updated based on the result of an error correction operation, so as to overcome the problem tied to the cells degradation during the life of the memory device.

Employing the aforementioned controlling block for adjusting the bias voltage of the switching element of the page buffer included in the non-volatile memory based on the inputted address information, it is possible to consider different resistive values of the bit-lines depending on the address zone to which the inputted address belongs during the read operation. Thus, more sophisticated and precise detection of a threshold voltage of a cell transistor can be achieved. This is particularly useful in a case of a drastic reduction of the pitch between the bit-lines and/or very small bit-lines needed with the continuous miniaturization of the semiconductor technology. Moreover, by updating the PBSENSE voltage in the look-up table 820 based on the result of an error correction, improved correct reading can be performed when the memory device gets degraded as the device gets old.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A controlling block for a non-volatile memory device including a switching element coupling a bit-line with a corresponding page buffer, the controlling block comprising:

a look-up table suitable for storing information regarding a plurality of address zones of a memory cell array; and a matching logic suitable for matching one address zone among the plurality of address zones based on an inputted row address, generating and providing a bias voltage based on the address zone to the switching element for performing a read operation of the non-volatile memory, wherein the plurality of address zones are defined by grouping word-lines based on a current-voltage (I-V) characteristic, and wherein the matching logic comprises:

a plurality of comparison blocks, each of the comparison blocks corresponding to each of the plurality of address zones, wherein each of the comparison blocks is configured to receive the inputted row address and to output a matching signal indicating whether the inputted row address belongs to the corresponding address zone or not.

2. The controlling block of claim 1, wherein the switching element is a transistor, and the bias voltage is applied to a gate of the transistor.

3. The controlling block of claim 1, wherein the plurality of word-lines in an address zone have I-V characteristics which differ for the current value less than a prefixed value.

4. The controlling block of claim 3, wherein the information regarding the plurality of address zones is obtained from the I-V characteristic of the non-volatile memory device by a wafer test.

5. The controlling block of claim 1, wherein each of the plurality of address zones includes a start address and an end address.

6. The controlling block of claim 1, wherein the matching signal is applied to the look-up table to retrieve a corresponding voltage value from the look-up table.

7. The controlling block of claim 1, wherein the comparison block comprises:

a first logic comparator for determining whether the inputted address is higher than the start address of the corresponding comparison block;

a second logic comparator for determining whether the inputted address is lower than the end address of the corresponding comparison block; and an AND gate for receiving the outputs of the first and second logic comparators and outputting the matching signal.

8. The controlling block of claim 1, wherein the look-up table stores a plurality of voltage values for each address zone for corresponding to different operating temperatures.

9. The controlling block of claim 1, comprising a plurality of look-up tables, each look-up table for a different operating temperature.

10. The controlling block of claim 9, wherein the number of address zones of each of the look-up tables is different from each other.

11. The controlling block of claim 1, wherein the bias voltage is determined based on a reference voltage and a voltage value corresponding to the matched address zone.

12. The controlling block of claim 6, wherein the voltage value stored in the look-up table is configured to be updated based on the result of error correction operation.

13. The controlling block of claim 1, wherein the matching of the address zone is performed simultaneously during the rising time of address line voltages through which the inputted row address is provided.

14. A non-volatile memory device comprising:
a memory cell array;
a page buffer including a switching element coupling the page buffer with a bit-line; and
a controlling block including:
a look-up table suitable for storing information regarding a plurality of address zones of the memory cell array; and
a matching logic suitable for matching one address zone among the plurality of address zones based on an inputted row address and generating and providing a bias voltage, based on the address zone, to the switching element for a read operation of the non-volatile memory,
wherein the plurality of address zones are defined by grouping word-lines based on a current-voltage (I-V) characteristic, and
wherein the matching logic comprises:
a plurality of comparison blocks, each of the comparison blocks corresponding to each of the plurality of address zones, wherein each of the comparison blocks is configured to receive the inputted row address and to output a matching signal indicating whether the inputted row address belongs to the corresponding address zone or not.

15. A method for adjusting a biasing voltage applied to memory cells of a non-volatile memory device including a memory cell array, a page buffer block, a data input/output circuit, and a row decoder, and wherein the memory cell array is coupled to the page buffer block through bit-lines and is coupled to the row decoder through word-lines, the method comprising:
obtaining a current-voltage (I-V) characteristic of the memory cell array and dividing the memory cell array into address zones, each comprising a group of word-lines of the memory cell array reflecting different resistive values depending on the I-V characteristic of the memory cell array to be read;
providing at least one look-up table for storing the plurality of address zones;
comparing an inputted row address of the memory cell to be read with the plurality of address zones through a matching logic including a plurality of comparison blocks, each of the comparison blocks corresponding to each of the plurality of address zones;
retrieving a corresponding voltage value from the look-up table; and
activating a controlling block including a switching element to provide a bias voltage to the addressed bit-lines, the bias voltage being determined based on the voltage value retrieved in the previous phase,
wherein the comparing of the inputted row address comprises:
receiving, by each of the comparison blocks, the inputted row address and outputting a matching signal indicating whether the inputted row address belongs to the corresponding address zone or not.

16. The method according to claim 15, wherein the look-up table stores a plurality of voltage values for each corresponding address zone, each voltage value usable for different operating temperature.

17. The method according to claim 15, wherein the at least one look-up table comprises a plurality of look-up tables for different operating temperatures, and each of the plurality of look-up tables stores a plurality of voltage values for each corresponding address zone.

18. The method according to claim 16, wherein said plurality of voltage values stored in the look-up table is configured to be updated based on the result of an error correction operation.

19. The method according to claim 16, wherein said look-up table stores a start address and an end address for each address zones of said plurality of address zones.

* * * * *

UNITED STATES PATENT AND TRADEMARK OFFICE
CERTIFICATE OF CORRECTION

PATENT NO. : 9,697,906 B2
APPLICATION NO. : 15/214161
DATED : July 4, 2017
INVENTOR(S) : Alessandro Sanasi Page 1 of 1

It is certified that error appears in the above-identified patent and that said Letters Patent is hereby corrected as shown below:

On the Title Page

Change the Foreign Application Priority Data section as follows:

Jul. 20, 2015    (IT) .........................................102015000036057

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*